[54] DRAG MODIFICATION PIEZOELECTRIC PANELS

[76] Inventor: Seymour Edelman, 9115 Glenridge Rd., Silver Spring, Md. 20910

[21] Appl. No.: 220,892

[22] Filed: Dec. 24, 1980

[51] Int. Cl.³ .................. H04R 17/00; H01L 41/08
[52] U.S. Cl. .................................... 310/316; 310/338; 73/861.72; 73/DIG. 4
[58] Field of Search ............................ 310/316–319, 310/328–333, 338; 73/702–704, 774–778, DIG. 4, 861.18, 861.21, 861.71, 861.72; 137/830, 831

[56] References Cited

U.S. PATENT DOCUMENTS

| | | | |
|---|---|---|---|
| 2,569,987 | 10/1951 | Frondel | 73/DIG. 4 |
| 3,745,384 | 7/1973 | Blanchard | 310/338 X |
| 3,749,948 | 7/1973 | Morris | 310/338 X |
| 3,988,620 | 10/1976 | McDavid | 310/328 |
| 4,140,936 | 2/1979 | Bullock | 310/328 |

Primary Examiner—William M. Shoop
Assistant Examiner—Peter S. Wong
Attorney, Agent, or Firm—Brady, O'Boyle & Gates

[57] ABSTRACT

Disclosed is a method and means to increase or decrease, on demand, the drag exerted by a fluid on a boundary. The boundary comprises a surface portion of a structure enclosing a moving fluid or may comprise a portion of the outer surface of an object moving through the fluid. Drag is varied by means of a set of piezoelectric sensors and an accompanying set of piezoelectric driver elements arranged in close proximity to one another at the boundary and electrically interconnected so that the pressure exerted by the moving fluid is sensed by one or more sensors and converted to an electrical signal which is then transformed into an electrical drive signal which is applied to one or more driver elements to cause a flexing of the driver element(s) in a predetermined direction so that drag is either reduced by moving the driver(s) away from the fluid or increased by moving the driver(s) towards the fluid. In the case of turbulent flow, drag is decreased by decreasing the pressure gradient in the fluid; that is, the drivers are moved away from the fluid in regions of high pressure and toward the fluid in regions of low pressure. The drag is increased by reversing these motions.

28 Claims, 11 Drawing Figures

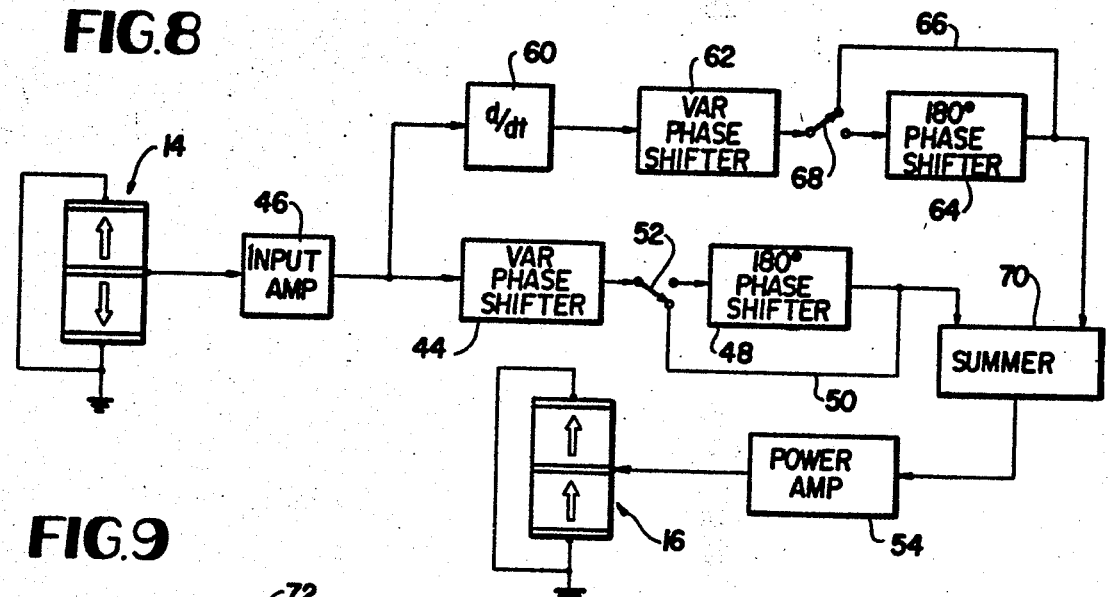
FIG.8
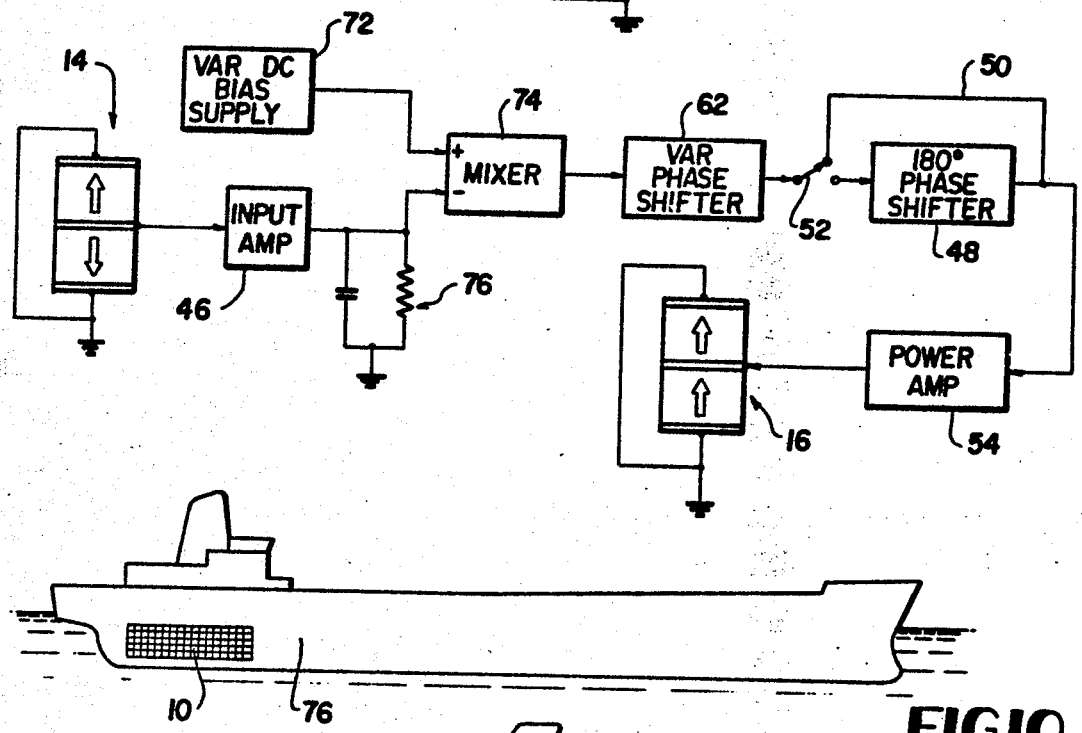
FIG.9
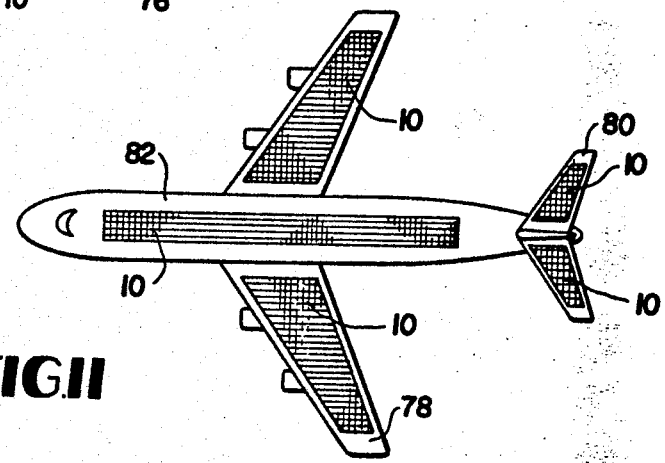
FIG.10
FIG.11

DRAG MODIFICATION PIEZOELECTRIC PANELS

FIELD OF THE INVENTION

The present invention relates to a method and means for reducing the drag exerted by a fluid on a surface and more particularly to a method and means whereby piezoelectric elements are utilized to actively detect the motion of the fluid on a boundary surface and in accordance with the sensed condition causing a motion of the boundary surface to respond by either moving the boundary area toward or away from the fluid flow as desired.

In the past much effort has been expanded in the study of the relationship between fluid drag and the motion of a boundary surface; however, none of the prior efforts have attempted to tie the motion of the boundary surface to the fluid motion except passively by using a compliant surface.

Accordingly, it is an object of the present invention to provide an active system for varying the motion of the boundary surface of a moving fluid in response to the motion of the fluid.

It is another object of the present invention to use piezoelectric materials to reduce fluid drag.

A further object of the present invention is to provide drag reduction of fluid flow by reducing the pressure exerted by the fluid on a surface where it is high while raising the pressure where it is low.

SUMMARY

Briefly, the subject invention is directed to the method and apparatus for reducing fluid drag on a boundary surface through which or over which a fluid moves by piezoelectrically sensing the pressure distribution which controls the drag on the boundary, amplifying the resulting electrical signal, selectively operating on the phase of the electrical signal by a predetermined magnitude and then applying the amplified phased signal to piezoelectric material which is caused to flex in a predetermined direction whereby movement away from the fluid will reduce pressure while movement toward the fluid will increase pressure at the area of concern.

These and other objects will become more apparent when the following detailed description is considered in view of the accompanying drawings.

DESCRIPTION OF THE DRAWINGS

FIG. 8 is an electrical schematic diagram of a second type of electrical circuitry utilized for operating the sensor-drivers of the subject invention;

FIG. 9 is an electrical block diagram of a third type of electrical circuit for operating the sensor-driver of the subject invention;

FIG. 10 is a diagram illustrative of another form of utilization for the subject invention; and FIG. 11 is a diagram illustrative of yet another form of utilization of the subject invention.

DESCRIPTION OF THE PREFERRED EMBODIMENTS

As noted above, the purpose of the subject invention is to increase or decrease, on demand, the drag exerted by a fluid on a boundary surface, which boundary may be part of a structure enclosing a moving fluid or it may be part of the outer surface of an object moving through the fluid. The apparatus by which the drag is varied consists of a set of piezoelectric sensors and drivers arranged in such a fashion at the boundary surface that a particular sensor is adapted to operate a respective driver or a group of drivers or alternatively a group of sensors collectively operate a single driver or a group of drivers. For sake of simplicity and clarity, however, the subject invention will be described in terms of a single piezoelectric sensor being used in connection with a respective piezoelectric driver.

Figure 1:
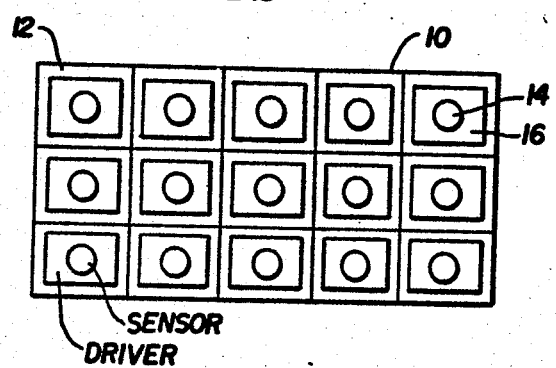
FIG. 1 is an illustrative diagram of a piezoelectric sensor-driver array in accordance with the preferred embodiment of the subject invention.

To this end reference will now be made to the drawings and more particularly to FIG. 1 wherein reference numeral 10 designates a compliant base member in the form of a panel which is separated into a plurality of resilient or flexible generally rectangular sections 12, each of which accommodates a piezoelectric sensor element 14 mounted in piggy-back fashion on a piezoelectric driver element 16. Accordingly, an array of sensor-drivers is provided on the panel 10. As shown in FIG. 1, the sensor 14 is relatively smaller than the driver 16 and is generally circular in configuration whereas the driver is of a generally rectangular configuration.

Figure 2:
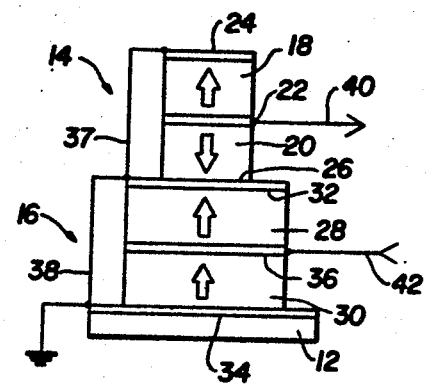
FIG. 2 is an electrical schematic representation of one piezoelectric sensor-driver combination utilized in the array shown in FIG. 1.

The piezoelectric sensor-driver configuration of each section of the array is shown schematically in FIG. 2. The preferred construction for each sensor 14 is a combination of two sheets 18 and 20 of piezoelectric material cemented face to face and oppositely polarized with respect to one another such that when the element 14 is subjected to pressure, the common interface 22 provides a charge of the same polarity while both outer faces 24 and 26 generate a charge of the opposite polarity. In like fashion, the preferred construction for each driver element is a combination of two sheets of piezoelectric material 28 and 30 cemented in face-to-face relationship, however, they have a like mutual polarity i.e. in the same direction, such that when their outer faces 32 and 34 are connected together and a signal is applied to their common interface 36, one sheet expands while the other contracts, causing the combination of both layers 28 and 30 to flex in the same direction as determined by the polarity of the applied signal. When desirable a single sheet configuration may be utilized.

However, in the embodiment disclosed both the outer faces 24 and 26 of the sensor element 14 are connected together via an electrical connection 37 while the outer faces 32 and 34 of the driver element 16 are connected together by means of electrical connection 38. Furthermore, both electrical connections 37 and 38 are adapted to be connected to a point of reference potential, commonly referred to as ground.

Accordingly, with the piezoelectric sensor configuration 14 cemented to the upper surface 26 of the driver element 16 and an electrical circuit connection 40 being made to the sensor interface 22 while an electrical connection 42 is made to the driver interface 36 a structure results which can sense the pressure exerted on the panel 12 whereupon an electrical signal appears on circuit lead 40 which is coupled to the interface 22. The pressure can then be counteracted or increased by means of applying a drive signal generated from the sensor signal to circuit lead 42 connected to the interface 36 of the driver 16. Where the pressure exerted comprises the drag exerted by a fluid in contact with the sensor 14, the electrical signal produced on circuit lead 40 would be coupled to electrical circuitry such as shown in FIG. 3 whereby the signal appearing on circuit lead 40 is amplified, altered in phase if desired or necessary, and reapplied to circuit lead 42 which causes the driver element 16 to flex in one direction or another depending upon the result desired, i.e. moving an area of the boundary away from the fluid will reduce pressure at that area while moving the area toward the fluid will increase the pressure at that area.

Figure 3:
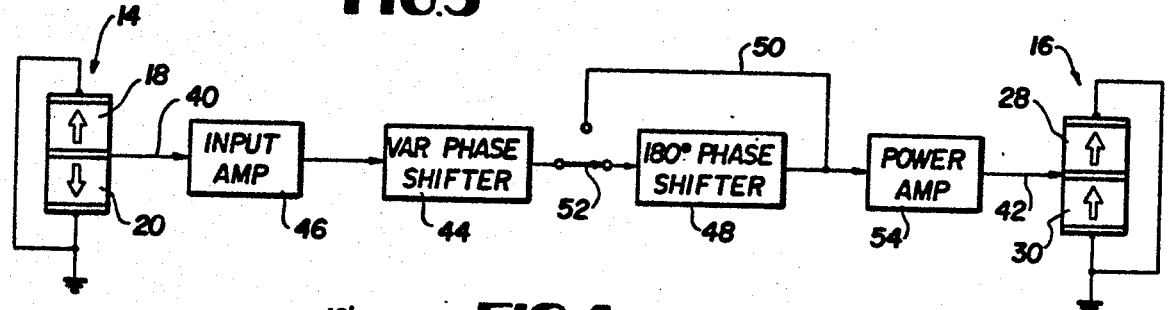
FIG. 3 is an electrical block diagram for one type of electrical circuit for operating a particular sensor-driver combination.

In its simplest form, the circuitry required to implement such a function is shown in FIG. 3 and includes inter alia, means for amplifying and selectively adjusting and varying, if need be, the phase between the sensor signal and the signal applied to the driver. Said circuit means includes a signal phase shifter 44 coupled to the output of a signal amplifier 46 connected between the sensor element 14 and the phase shifter. In addition to the phase shifter 44, which comprises a variable phase shifter, there is included 180° phase shifter circuit 48 and a by-pass signal path 50 which, respectively, provides a reversed phase and a substantially in-phase driver signal being applied to the piezoelectric driver 16 depending upon the setting of the switch 52. In order to provide additional amplification of the signal to the driver element 16 an additional amplifier 54 is provided; however, when desirable, it may be eliminated where the gain of the input amplifier 46 is sufficient to provide the necessary amplification to the signal being applied to the circuit lead 42.

Thus drag can be reduced by moving the driver 16 away from the fluid in the region of a high pressure and toward the fluid in a region of low pressure as dictated by signal output of the sensor 14 on the circuit lead 40. This particularly is pertinent for turbulent flow where drag is a function of pressure gradient. Alternatively, drag can be increased simply by reversing these motions. For example, where the switch 52 connects the variable phase shifter 44 to the 180° phase shifter 48, the piezoelectric driver 16 will operate to flex away from pressure whereas the condition of the switch 52 whereby the by-pass circuit 50 is coupled to the variable phase shifter 44 the driver element will move toward the region of pressure. In both cases the variable phase shifter 44 provides a means for adjusting the relative phases of the signals such that substantially zero or 180° phase shift exists between the output of the sensor 14 and the input to the driver 16.

Figure 4:
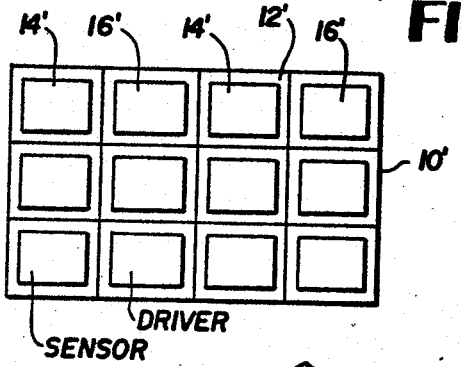
FIG. 4 is a diagram illustrative of a piezoelectric sensor-driver array in accordance with another embodiment of the subject invention.
Figure 5:
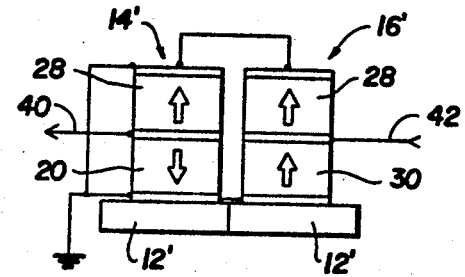
FIG. 5 is an electrical schematic diagram of one sensor-driver combination utilized in the array shown in FIG. 4.

While the configuration as disclosed in FIGS. 1 and 2 discloses what is at present considered to be the preferred embodiment of the invention, another embodiment thereof is shown in FIGS. 4 and 5. There 10' designates a compliant panel member having a plurality of flexible rectangular sections 12' which are adapted to accommodate an arrangement of alternating sets of piezoelectric elements of sensors 14' and drivers 16'. The respective drivers 14' and 16' are generally of a rectangular configuration of substantially the same size. As shown in FIG. 5, each sensor element is comprised of piezoelectric sheets 18 and 20 cemented in face-to-face relationship as the sensor element 14 shown in FIG. 2 and having the same relative polarity while the driver element 16' is comprised of piezoelectric layers 28 and 30 as before. In this configuration, the sensor-driver pair are not in piggy back configuration but are mounted side-by-side with their respective outer faces connected together to ground potential while the inner face 22 of the sensor element 14' has an output circuit lead 40 connected thereto while the inner face 36 of the driver element 16' is connected to an input circuit lead 42. The array of sensor-driver elements 14' and 16' shown in FIG. 4 is operable in the same fashion by means of, for example, circuitry shown in FIG. 3; however, it exhibits one limitation in that only the sections 12' containing the driver element 16' would flex in response to pressure being sensed by the adjacent sensors 14'.

Figure 6:
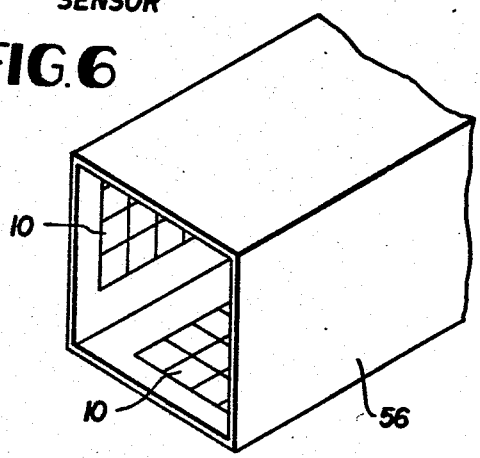
FIG. 6 is a partial perspective view of a fluid conduit which is adapted to utilize the subject invention.
Figure 7:
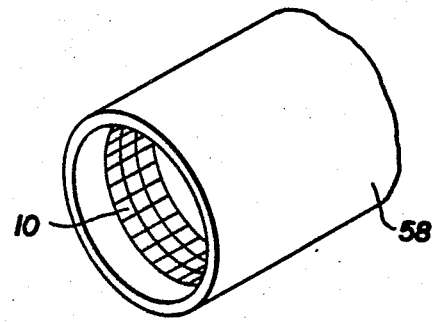
FIG. 7 is a partial perspective view of another type of conduit which is adapted to utilize the subject invention.

Nevertheless, the two embodiments of the invention provide a means whereby the motion of a fluid and the motion of the boundary surface can be actively linked together for modifying the drag exerted by the fluid on the boundary surface. To this end FIGS. 6 and 7 disclose two forms of fluid conduits of a generally rectangular and circular cross section, respectively, which contain inner boundary surface areas defined by one or more piezoelectric sensor-driver panels 10 as shown in FIGS. 1 and 4 suitably operated, for example, by circuitry shown in FIG. 3. Individual electrical connections provide no great problem, inasmuch as semiconductor integrated circuit chips or other such elements can be readily fabricated by one skilled in the art to operate various piezoelectric elements either individually or in groups. Further, under different conditions of fluid composition, fluid flow, relative speed and boundary shape, the relative pressure distribution may be the pressure at the center of the specific areas under consideration, the pressure at the upstream edge of the area under consideration, the pressure at some distance upstream, the pressure grading across the area, or some combination thereof. What is significant is that the panels 10 provide a boundary surface area which is actively operable to move away from fluid so as to reduce the pressure at that area or alternatively, can move toward the fluid and thus increase the pressure at that area.

While the circuitry shown in FIG. 3 is a relatively simple means of operating a particular sensor-driver pair, in instances where high speed fluid motion is encountered, it may be desirable to anticipate pressure values by differentiating the sensor signal and employing a circuit configuration such as shown in FIG. 8 whereby in addition to the variable phase shifter 44 and the 180° phase shifter 48 as well as the by-pass circuit arrangement including the circuit lead 50 and switch 52, coupled between the input amplifier 46 and the power amplifier 54, a differentiator circuit 60, a second variable phase shifter 62 and another 180° phase shift circuit 64 and a by-pass circuit 66 and switch therefor 68. Both signal channels feed into a signal summer circuit 70 where a composite signal is formed for driving the piezoelectric element 16.

The circuitry shown in FIGS. 3 and 8 are illustrative of two circuit configurations whereby a piezoelectric driver element 16 is driven in response to the signal generated solely by a piezoelectric sensor element 14, it being noted, however, that when desirable a plurality of piezoelectric driver elements can be driven in response to the signal generated by a single sensor or alternatively, a single driver element can be driven in response to the sensor signals generated by one or more individual sensors. The circuitry in FIG. 9, however, is intended to illustrate yet another circuit configuration for operating a piezoelectric sensor-driver combination wherein the sensor 14 is utilized to provide a negative feedback signal from the driver 16 which operates in response to a command signal provided, for example, by means of a variable DC supply circuit 72. Such a combination additionally includes a signal mixer 74 whereby the signal inputs from the sensor 14 and the DC power supply 72 are algebraically summed, i.e. subtracted from one another in a negative feedback sense to provide an error signal to the variable phase shift circuit which is adapted to cause the driver 16 to operate in such a manner that the feedback signal provided by the sensor 14 will act in a servo mode whereby a zero error signal will occur. In such a mode the driver 16 is caused to follow the variation of the DC bias supply 72. The circuitry in FIG. 9 also includes a resistance-capacitance averaging network 76 which has an RC time constant sufficiently large to provide a smoothing effect for a turbulent eddy, for example, to pass the sensor 14.

A circuit such as shown in FIG. 9 has particular utility in certain applications where it is desirable to vary the drag of fluid moving around an external surface, a typical example of which is the hull of a ship as shown in FIG. 10 and the air foil surfaces and/or fuselage surface of an air craft as shown in FIG. 11. With respect to FIG. 10, reference numeral 76 designates a ship, for example, which includes at least one piezoelectric sensor-driver panel 10 of predetermined size and numbers positioned on either side of the aft portion of the hull 76 below the water line. Where, for example the array of sensor-driver elements on one side operates to increase the drag, while the corresponding array on the other side of the hull reduces the drag thereat, a steering effect is achieved which may be utilized when desirable to either complement the conventional steering mechanism or by suitable design, can be implemented to provide the sole means of guidance. While not shown, other additional piezoelectric sensor-driver panels 10 can be located on the hull, for example in the forward portion thereof, to provide a drag modification surface for the sea water passing the hull at that particular location.

With respect to the configuration shown in FIG. 11, a plurality of piezoelectric sensor-driver panels 10 are selectively located along the wing surfaces 78, the elevator surfaces 80 and over a predetermined portion of the fuselage section 82. Such an arrangement is purely one of illustration in that more than one panel 10 can be applied at any location where drag of air flow over any outer surface of the air craft can be varied as desired. Where, for example, panel members 10 are located on the upper and lower surfaces of the wing and operated in such a fashion that the drag is increased on one surface panel while decreased on the other surface, the lift over the wing surface can be modified to provide either a guidance function or a trimming function or a combination of both. While not so evident, piezoelectric sensor-driver panels 10 can be applied to upper and lower portions of the fuselage 82 and operated in mutually opposite senses to provide the same effect.

Accordingly, what has been shown and described is a method and apparatus by which drag on an area is varied by: piezoelectrically sensing the pressure distribution which controls the drag on the area of interest, suitably amplifying the electrical signal produced by the sensing step and where applicable thereafter differentiating the amplified signal, varying the phase of the sense signal, if necessary, to substantially be either in phase or 180° out of phase with the sense signal and thereafter applying the phased signal to a piezoelectric driver element to cause a flexing of the boundary surface at the sensed area and/or adjacent vicinity to move either toward or away from a fluid moving over the boundary surface and thereby increase or decrease, as the case may be, the drag exerted by the fluid on the boundary.

While the foregoing detailed description has been described with a certain degree of particularity, it is to be noted that such has been presented by way of illustration and not by limitation and accordingly all modifications, alterations and changes coming within the spirit and scope of the present invention as defined by the appended claims are herein meant to be included.

I claim:

1. The method of modifying the drag exerted by a fluid on a boundary surface, comprising the steps of:
   sensing effect of the drag exerted by the fluid on said boundary surface;
   generating an electrical signal which is a function of the drag sensed;
   modifying the electrical signal in a predetermined manner for energizing an electrical energizable movable element at said boundary surface; and
   applying said modified electrical signal to said movable element at said boundary surface which is energized thereby and selectively moves toward or away from said fluid to modify the fluid drag exerted on said boundary surface.

2. The method as defined by claim 1 wherein said sensing step comprises sensing by means of a piezoelectric sensor element the pressure exerted by the fluid on the boundary surface.

3. The method as defined by claim 2 wherein said step of applying comprises applying said electrical signal to a piezoelectric driver element which is operable to flex bi-directionally toward or away from said fluid in response to said modified electrical signal.

4. The method as defined by claim 3 wherein said piezoelectric sensor element and said piezoelectric driver element are located in close proximity to one another.

5. The method as defined by claim 4 wherein said step of modifying the electrical signal includes amplifying said electrical signal generated as a function of the drag exerted.

6. The method as defined by claim 4 wherein said step of modifying the electrical signal comprises selectively adjusting the phase of said electrical signal for causing said driver element to move toward said fluid.

7. The method as defined in claim 4 wherein said step of modifying comprises altering the phase of said electrical signal for moving said driver element away from said fluid.

8. The method as defined by claim 4 wherein said step of modifying comprises differentiating said electrical signal which is adapted to anticipate pressure exerted by a fluid having a relatively high speed of motion over said boundary surface.

9. The method as defined by claim 1 wherein said sensing step comprises sensing the drag exerted by fluid on an inner boundary surface of a fluid conductive structure.

10. The method as defined by claim 1 wherein said step of sensing the effect of the drag comprises sensing pressure exerted by the fluid on the outer surface of an object moving through said fluid.

11. Apparatus for modifying fluid drag on a boundary surface, comprising in combination:
first piezoelectric means for sensing the effect of drag exerted by a fluid on said boundary surface and being operable to generate an electrical signal in accordance with the drag sensed;
electrical circuit means for transforming said electrical signal generated by said first piezoelectric means into an electrical drive signal capable of energizing piezoelectric means; and
second piezoelectric means coupled to said drive signal and being energized thereby and becoming flexed to cause said boundary surface to move in a predetermined direction relative to said fluid and thereby modify the drag exerted thereby.

12. The apparatus as defined by claim 11 wherein said boundary surface comprises a compliant surface and said second piezoelectric means is located on said compliant surface.

13. The apparatus as defined by claim 12 wherein said first piezoelectric means is also located on said compliant surface.

14. The apparatus as defined by claim 13 wherein said first and second piezoelectric means are comprised of separate piezoelectric elements, each consisting of sandwiched layers of piezoelectric material.

15. The apparatus as defined by claim 14 wherein said first piezoelectric element is comprised of at least two layers of piezoelectric material which are bonded together in a mutually opposite electrical polarity relationship whereby a common polarity electrical signal is generated at the inner face thereof in response to a pressure exerted by said fluid on said boundary surface.

16. The apparatus as defined by claim 14 wherein said second piezoelectric element comprises at least two layers of piezoelectric material bonded together in mutually like polarity relationship whereby electrical drive signal coupled to the inner face thereof causes a flexing of both piezoelectric layers in the same direction.

17. The apparatus as defined by claim 14 wherein said first and second piezoelectric elements are mounted in a piggy-back arrangement on said boundary surface.

18. The apparatus as defined by claim 11 wherein said first and second piezoelectric means comprises a first and second set of piezoelectric sensor and driver elements, respectively, located on said boundary surface.

19. The apparatus as defined by claim 18 wherein said boundary surface comprises a compliant boundary surface having a plurality of individual surface sections and wherein each section includes at least one piezoelectric element of said first and second sets of piezoelectric elements.

20. The apparatus as defined by claim 19 wherein said each surface section includes one sensor element and one driver element.

21. The apparatus as defined by claim 20 wherein said electrical circuit means comprises individual circuit means coupled between a selected sensor and driver element located on each surface section.

22. The apparatus as defined by claim 21 wherein said sensor and driver elements are mounted on top of one another on said surface section.

23. The apparatus as defined by claim 11 wherein said electrical circuit means includes circuit means for altering the electrical phase of said electrical signal generated by said first piezoelectric means to cause said boundary surface to move away from said fluid.

24. The apparatus as defined by claim 11 wherein said electrical circuit means includes signal amplifying means and phase alteration means, said phase alteration means being adapted to move said boundary surface in said predetermined direction relative to the drag exerted by said fluid on said boundary surface.

25. The apparatus as defined by claim 11 wherein said electrical circuit means includes signal amplifying means and signal differentiating means.

26. The apparatus as defined by claim 11 wherein said first and second piezoelectric means comprises respective sets of piezoelectric elements located on first and second flexible panel members affixed to opposite sides of a structure moving through said fluid and wherein said circuit means comprises means coupled to said first and second sets of piezoelectric elements whereby drive signals applied to the second piezoelectric elements of said first panel moves said first panel in a first direction relative to said fluid and the second piezoelectric elements of said second panel moves said second panel in a second direction relative to said fluid to provide a steering effect of said object.

27. The apparatus as defined by claim 26 wherein said object comprises a vehicle moving through a liquid.

28. The apparatus as defined by claim 26 wherein said object comprises a vehicle moving through a gaseous medium.

* * * * *